United States Patent [19]

Meyerhoff et al.

[11] 4,435,844

[45] Mar. 6, 1984

[54] REMOTE CONTROL CIRCUIT

[75] Inventors: Jerome D. Meyerhoff, Buffalo Grove, Ill.; Steven E. Forshay, Ardmore, Pa.

[73] Assignee: Motorola, Inc., Schaumburg, Ill.

[21] Appl. No.: 301,868

[22] Filed: Sep. 14, 1981

[51] Int. Cl.³ .......................... H04B 1/10; H04B 1/16
[52] U.S. Cl. .................................... 455/218; 455/343; 455/352
[58] Field of Search ............... 455/343, 218, 345, 352, 455/355; 361/203; 340/661–663

[56] References Cited

U.S. PATENT DOCUMENTS 3,453,547  7/1969  Rigsbee et al. ................ 455/343

*Primary Examiner*—Marc E. Bookbinder
*Attorney, Agent, or Firm*—Margaret Marsh Parker; James W. Gillman; James S. Pristelski

[57] ABSTRACT

A remote unit can be controlled by sensing the change of impedance in the power line of a control unit as the control unit is turned on. The power line circuit includes a portion of an oscillator which is damped by the turn-on. Functions such as power turn-on and temporary audio muting are possible with minimal voltage drop in the power line.

8 Claims, 2 Drawing Figures

REMOTE CONTROL CIRCUIT

BACKGROUND OF THE INVENTION

The present invention relates to the field of wired remote control circuits and, more particularly, to a circuit which will not reduce the supply voltage in the control unit.

In a system such as the radio receiver for an automobile, the customary arrangement includes an antenna on the exterior of the vehicle, a tuner and amplifier placed behind the dashboard and one or more loudspeakers placed as appropriate in the interior of the vehicle. By some individual standards for audio signals, the usual automobile radio does not supply enough audio power. Higher powered audio amplifiers and additional speakers have sometimes been added to provide this desired audio level. It is desirable to activate these expanded systems with the original radio controls, but most known systems have reduced the voltage supply to the original radio. Since many automobile radios are designed to operate optimally within a narrow range of supply voltages, any reduction in the A+ supply can produce severe effects on performance. One example of such a system is the use of a PN junction device in the DC supply lead of the control unit (receiver) to produce a detectable voltage drop when the control unit is activated, with the voltage drop creating a change in logic level in the control line. Another control system runs the DC supply for the control unit through a relay coil. Each of these produces an undesirably large voltage drop for the control unit supply.

SUMMARY OF THE INVENTION

It is an object of the present invention to provide a remote control circuit in which there is minimum voltage drop in the power line of the control unit.

It is another object to provide multiple control functions in the remote unit at turn-on of the control unit.

These objects and others are obtained by using an oscillator/transformer combination coupled into the power line of the control unit. The oscillator is free-running when the control unit is turned off. When the control unit is turned on, the lower impedance of its power input line damps oscillation and a detection circuit responds by enabling the power supply to the remote unit. If desired, a secondary function such as temporary audio muting can be provided by the same detection circuit.

DETAILED DESCRIPTION OF THE PREFERRED EMBODIMENT

Figure 1:
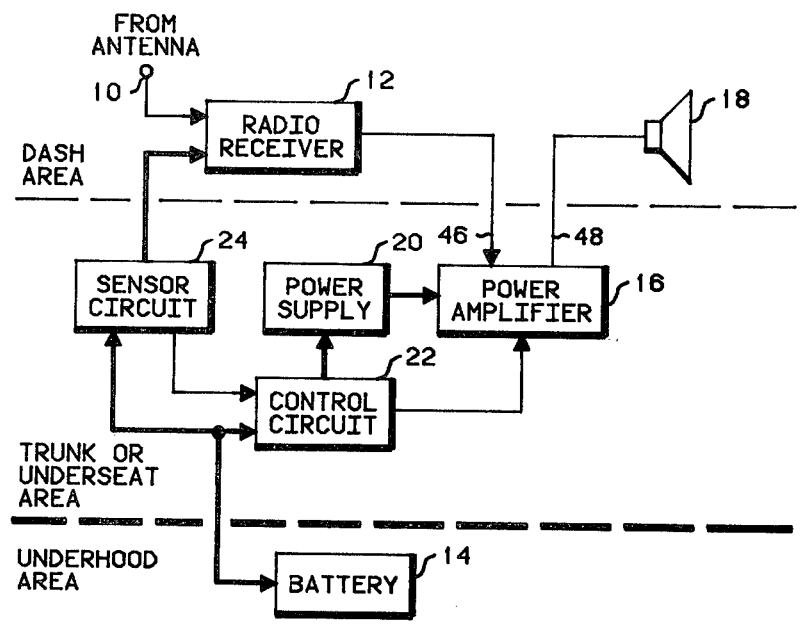
FIG. 1 is a block diagram of a typical system utilizing the invention.

The diagram of FIG. 1 is divided into three areas for ease in understanding the environment described herein. It is to be noted, however, that no limitations as to environment or the particular application of the invention are intended, and none should be inferred.

The described environment is that of a vehicle which would include an antenna connection 10 (antenna not shown) coupled to a radio receiver 12 located in the dashboard area of the vehicle, the power source for the radio being the vehicle battery 14 located underhood. The problem now is to add to this conventional arrangement a high power audio amplifier 16 and (possibly) additional loud speakers 18. The amplifier 16 will be associated with an extra power supply 20, a control circuit 22 and a sensor circuit 24.

In order to avoid the addition of an extra set of controls for the elements 16-20, the circuit of the present invention enables all of them when power is supplied to the radio receiver 12 as by actuation of the radio on-off switch. The radio receiver in the present system can be considered as the "control unit" (as distinguished from the control circuit 22) since activation of the radio on-off switch is the specific operative element. Obviously, it is the audio signals from the receiver 12 which are amplified in the power amplifier 16 and coupled to the speakers 18. Such would not be the case in all applications of the invention. For clarity in FIG. 1 DC power connections are represented by the heavier lines (with no ground connections shown) and audio and control signals are shown as lighter lines. Thus, it may be seen that the A+ supply for the receiver 12 is coupled through the sensor circuit 24, and a control signal is coupled from the sensor circuit to the control circuit 22 to the power amplifier 16. Audio signals are coupled from the receiver 12 through the power amplifier 16 to the added speakers 18. The control signals from the control circuit 22 are, in present application, utilized to provide the temporary muting of the audio signals in the power amplifier 16 as will be explained below with respect to FIG. 2. It is to be noted that although single lines are shown for the audio connections, these may represent any desired number of audio or other types of channels.

Figure 2:
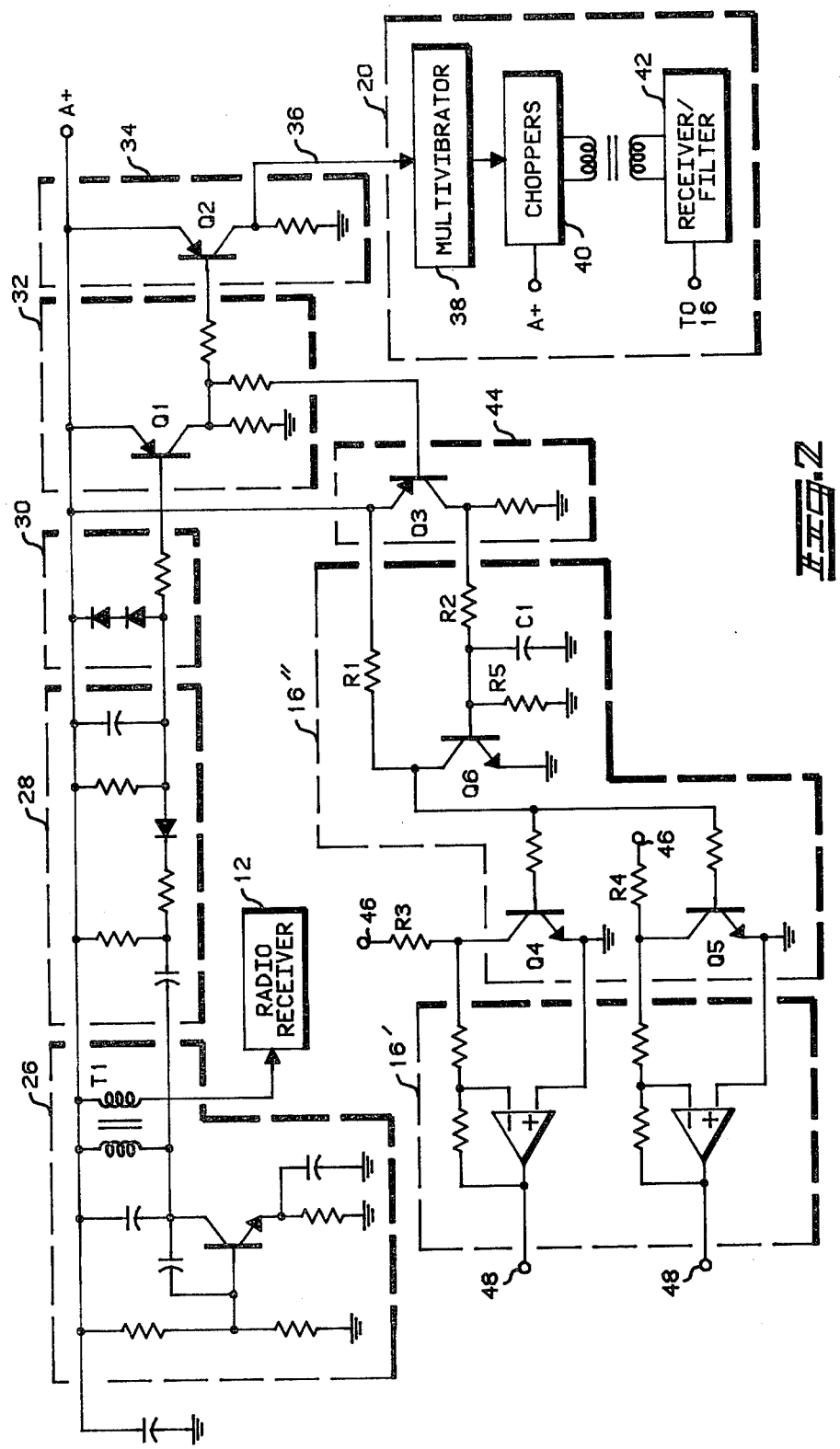
FIG. 2 is a schematic diagram of the invention.

FIG. 2 is a schematic diagram of a preferred embodiment of the invention wherein an oscillator circuit 26 in the sensor circuit 24 free-runs at a frequency which can be any desired frequency but which is typically relatively low in order for an impedance change in the tuned circuit to have maximum effect. A transformer T1 forms a portion of the tuned circuit of the oscillator and the A+ connection for the receiver 12 passes through the secondary winding of T1. The A+ connection is a high impedance when the control unit (receiver) 12 is turned off, but is low enough to damp oscillation in the oscillator 26 when the control unit is turned on.

The oscillator 26 is coupled to a detector circuit 28 which rectifies and filters the oscillating signal and couples it to a limiter circuit 30. The DC output of the limiter 30 is applied to the base of a transistor Q1 in a switching circuit 32 which controls the operation of a transistor Q2 in an isolator circuit 34. The transistor Q2 in turn controls the A+ power connection to the power supply 20 for the power amplifier 16. When the control unit 12 is off and the oscillator 26 is free-running, the collector of Q2 is at ground potential. When the control unit is turned on and the oscillator circuit 26 is disabled, the collector of Q2 is at A+. A terminal 36 at the collector of Q2 is coupled to turn on the transistors in an astable multivibrator 38 which drives "choppers" 40 in a switching power converter which also includes a rectifier/filter section 42. The power required for the multivibrator 38 may be in the order of a few milliamperes which ultimately control upwards of 50 watts of DC power for the power amplifier 16. The A+ line (from the car battery) thus can go directly to the choppers and rectifier without passing through any relays, switches, diodes or other such lossy devices.

The collector of Q1 in the switching circuit 32 may also be coupled to a second isolator circuit 44 wherein the collector of a transistor Q3 provides a second, isolated logic signal of the same polarity and potential as did the collector of Q2. This second logic signal is used to provide for a temporary muting of the audio power amplifier 16 since at such high audio power levels it is desirable to allow the system to stabilize before a full output is produced. The power amplifier 16 is shown in FIG. 2 in two portions; 16' which includes stereo power amplifiers, and 16" which includes the muting circuits for the amplifiers.

When the control unit (receiver) 12 is turned on, power is immediately supplied to the amplifier 16 but transistors Q4, Q5, which were saturated by a voltage from R1, are held saturated until a capacitor C1 charges to the turn-on potential of a transistor Q6. A typical time constant, as supplied by C1 and R2, would be 500 msec.

When Q6 saturates, Q4 and Q5 are cut off and no longer serve as shunts or voltage attenuators with respect to resistors R3, R4 which couple audio to the amplifier 16 from terminals 46 (representing the audio line or lines from the receiver 12). Thus when Q6 saturates, audio appears at the output terminals 48 of the power amplifier 16.

When the control unit is turned off, the collector of Q3 quickly becomes a high impedance and C1 can discharge through R5 in less time than the charging time. Transistor Q6 is thus cut off quickly and the audio signals are muted almost instantaneously, as is desirable.

Thus, there has been shown and described means for controlling the operation of a remote unit simply by turning on a control unit with no significant loss of power to the control unit. The control function may consist only of enabling the power supply of the remote unit or may include alternative or additional capabilities such as the temporary muting of the audio of the remote unit. Other control functions may be added or substituted as desired. Many modifications and variations of the present invention are possible and it is intended to cover all such as fall within the spirit and scope of the appended claims.

What is claimed is:

1. A control system for controlling the operation of a remote unit by detecting a change of operational mode of a control unit, the system comprising:
   a control unit;
   a power supply line for supplying power from an external source to the control unit; and
   a remote unit including;
   a free-running oscillator having a tuned circuit, said control unit power line being coupled through the tuned circuit to the control unit, the operational mode of the control unit as indicated by the operative condition of the power supply line affecting the function of the oscillator;
   a detection circuit coupled to the tuned circuit for detecting changes in oscillator functioning and providing a control signal in response to said changes; a controlled power supply coupled to the external power source; and
   a control stage responsive to said control signal and coupled to the controlled power supply for controlling the provision of power to a portion of the remote unit.

2. A control system in accordance with claim 1 wherein the detection circuit includes means for rectifying and filtering the oscillations from the tuned circuit, and the control stage includes switching means coupled to be switched by the control signal from the detection circuit.

3. A control system in accordance with claim 2 wherein the detection circuit further includes limiting means, and the control signal from the detection circuit is coupled to the switching means through the limiting means.

4. A control system in accordance with claim 2 wherein the control stage further includes an isolator circuit, the switching means being coupled to the power supply through said isolator circuit.

5. A control system in accordance with claim 4 wherein the control unit receives broadcast signals and includes means for deriving audio signals from the received signals, the control stage further includes a second isolator circuit coupled to the output of the switching means, and the portion of the remote unit includes at least one audio amplifier stage coupled to the control unit for receiving said audio signals and coupled to the switching means through said second isolator circuit and at least one audio muting circuit for muting the audio signals supplied to said amplifier stage, in response to said change of operational mode of said control unit.

6. A control system in accordance with claim 5 wherein the at least one muting circuit includes a voltage divider for supplying audio signals to the at least one amplifier stage, a transistor stage coupled to shunt at least a portion of said voltage divider, and timing means responsive to an output of said second isolator for enabling the shunting function of the transistor stage for a predetermined period of time.

7. A control system in accordance with claim 1 wherein the operational modes of the control unit are a first power-off condition and a second power-on condition, and the change from the off condition to the on condition prevents oscillation in said free-running oscillator.

8. A control system in accordance with claim 1 wherein the detection circuit provides a second control signal and the remote unit further includes an auxiliary circuit, said auxiliary circuit being controlled by the second control signal.

* * * * *